April 8, 1958 J. H. MYER ET AL 2,829,993

PROCESS FOR MAKING FUSED JUNCTION SEMICONDUCTOR DEVICES WITH ALKALI METAL-GALLIUM ALLOY

Filed June 24, 1955

JON H. MYER,
WARREN P. WATERS,
INVENTORS

BY Henry Heyman

ATTORNEY

United States Patent Office 2,829,993

Patented Apr. 8, 1958

2,829,993

PROCESS FOR MAKING FUSED JUNCTION SEMICONDUCTOR DEVICES WITH ALKALI METAL-GALLIUM ALLOY

Jon H. Myer, Los Angeles, and Warren P. Waters, Inglewood, Calif., assignors to Hughes Aircraft Company, Culver City, Calif., a corporation of Delaware Application June 24, 1955, Serial No. 517,848

12 Claims. (Cl. 148—1.5)

This invention relates to fused junction semiconductor devices and more particularly to an improved method of producing a fused junction in an active impurity-doped semiconductor starting crystal and to such improved devices.

In the semiconductor art a region of monatomic semiconductor material containing an excess of donor impurities and yielding an excess of free electrons is considered to be an N-type region, while a P-type region is one containing an excess of acceptor impurities resulting in a deficit of electrons, or stated differently, an excess of holes. When a continuous solid crystal of semiconductor material has one N-type region and one P-type region, it is termed a P–N junction semiconductor device, while a specimen having two N-type regions separated by a P-type region is termed an N–P–N junction semiconductor device.

On the other hand, it is sometimes desired to produce in a continuous solid crystal of N-type semiconductor material, an N-type region fused thereto to form therewith an ohmic contact to an external circuit. The term junction device, as herein utilized, is intended to include all of the aforementioned type semiconductor devices.

The term "semiconductor material," as utilized herein, is to be construed as including either germanium, silicon, germanium-silicon alloy, indium-antimonide, aluminum-antimonide, gallium-antimonide, indium arsenide, aluminum-arsenide, gallium-arsenide, lead sulfide, lead-telluride, lead-selenide, cadmium-sulfide, cadmium-telluride, and cadmium selenide. Although for the purpose of clarity the present invention will be disclosed with particular reference to germanium, it is to be understood that silicon or any of the other hereinabove mentioned semiconductor materials may be equally well utilized according to the method of the present invention.

The term "active impurities" is used to denote those impurities which affect the electrical characteristics of semiconductor material, as distinguished from other impurities which have no appreciable effect upon their characteristics. Generally, active impurities are added intentionally to the starting semiconductor material, although in many instances, certain of these impurities may be found in the original material. Active impurities are classified as either donors, such as antimony, arsenic, bismuth, and phosphorus, or acceptors such as indium, gallium, thallium, boron, and aluminum.

In the prior art, junctions have been produced in semiconductor materials by either of two well known processes, namely, the crystal-pulling technique, wherein the junction is grown by withdrawing a seed crystal from a doped melt of semiconductor material, and the fusion methods wherein a region on a semiconductor specimen or crystal of one conductivity type is converted to the opposite conductivity type. This invention deals exclusively with the latter class of devices.

According to a prior art fusion process for producing a fused-junction semiconductor device, a region of a semiconductor specimen of one conductivity type is converted to the opposite conductivity type by fusing thereto an active impurity, either alone or in alloy form. There will thus be produced a P–N junction as the starting semiconductor material retains the conductivity type as it originally existed, while a region of the opposite conductivity type is produced by the active impurity-doped alloy being fused thereto.

According to one method for producing a germanium N–P–N junction transistor, for example, two pellets of lead arsenic alloy are first prefused to opposite surface of a P-type germanium starting specimen. Thereafter, the combination is heated to a predetermined temperature above the melting point of the alloy, but below the melting point of the germanium, to melt the alloy pellets and to dissolve therein a predetermined amount of the adjacent germanium crystal, thereby creating two molten alloy regions of lead, arsenic, and germanium on the opposite surfaces of the crystal. The combination is then cooled at a predetermined rate to precipitate or redeposit onto the adjacent crystal a portion of the germanium, together with substituted atoms of arsenic, thereby producing two regrown regions of N-type germanium which may constitute the emitter and collector regions, respectively, of a transistor.

Another method for producing a fused-junction transistor is disclosed in copending U. S. patent application Serial No. 417,081 for "Fused Junction Transistors with Regrown Base Regions," by Justice N. Carman, Jr., filed March 18, 1954. In the copending application there is described an alternate technique for producing a fused-junction, high-frequency transistor. According to the basic concept therein disclosed, a fused-junction transistor includes a base region created by converting a portion of a semiconductor starting crystal of one conductivity type to the opposite conductivity type, the unchanged portion of the starting crystal constituting the collector region. The emitter region and its associated junction are then formed on the opposite or exposed surface of the base region by a second fusion operation, or by electro-forming therewith a properly doped conventional wire whisker.

According to these methods the alloy button upon cooling freezes out atop the regrown region at the end of the fusion operation and it is later either dissolved by a suitable solvent, after which another P–N junction may be formed with the regrown region, or alternatively it is not removed, but is instead used as an ohmic contact to the underlying regrown region. Such button can only be used as an ohmic contact when it is of the same conductivity type, i. e., when the active impurities in the alloy pellet are of the same type as those of the semiconductor starting crystal to which it is fused. In all of these methods wherein an alloy button containing the active impurity is used to form a junction it is necessary, if the junction is to be formed at moderate temperatures, to remove all oxides which may have formed along the fusion interface and to improve the wetting of the metal to the semiconductor starting crystal. Previously, success could only be achieved by the use of chemical fluxes placed on the wafer along with the alloy at the time of fusion.

The present invention obviates the requirement for the addition of chemical fluxes to allow for wetting and for removing of the oxide coatings at the fusion interface. Various alkali alloy fluxes have been used to perform this goal; however, they all require very high temperatures, e. g., of the order of magnitude of 800 degrees centigrade to melt the flux and perform the fusion. Further, the action of many of these fluxes on the surface of the wafer results in extensive damage to effective lifetime of charge carriers of the crystal because of the increased surface velocity induced by the damaged surface and the loss of bulk carrier lifetime resulting from the high temperatures.

It is therefore an object of this invention to provide a method of producing a fused-junction semiconductor device which obviates the requirement for a special fluxing agent.

Another object of this invention is to provide a method of producing a fused junction semiconductor device which permits fusion at a lower temperature than heretofore possible.

It is a further object of this invention to provide a method utilizing a self-fluxing material for producing fused-junction semiconductor devices.

According to the basic concept of the present invention an active agent is included directly in the alloy itself, which alloy will act as a self-fluxing agent. More specifically, alkali metals, such as sodium, cesium, rubidium and potassium which remain active as reducing agents even when alloyed with other metals, are included in the alloy as a self-fluxing agent.

The novel features which are believed to be characteristic of the invention, both as to its organization and method of operation, together with further objects and advantages thereof, will be better understood from the following description considered in connection with the accompanying drawing in which an embodiment of the invention is illustrated by way of example. It is to be expressly understood, however, that the drawing is for the purposes of illustration and description only, and is not intended as a definition of the limits of the invention.

Figure 1:
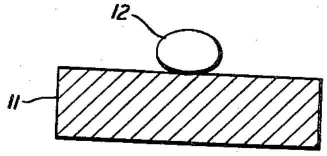
Fig. 1 is a sectional view of a semiconductor device in a preliminary stage of production according to the method of the present invention.

Referring now to the drawing, wherein like reference characters designate like or corresponding parts throughout the several views, there is shown in Fig. 1 a semiconductor starting crystal 11 which is arbitrarily assumed to be N-type germanium. Upon crystal 11 there has been placed an alloy pellet 12.

The alloy pellet 12, employed for creating a fused junction with the crystal 11 preferably includes three constituents, namely, a solvent metal, an alkali metal such as sodium, and gallium as an active impurity. The term "solvent metal" is used to signify that it is capable, when molten, of readily dissolving the semiconductor starting specimen or crystal 11 herein arbitrarily assumed to be N-type germanium. It need have further a relatively high rejection ratio with respect to germanium, or, in other words, tend to remain in the liquid phase during the fusion operation while readily precipitating the dissolved germanium back onto the parent crystal when the germanium specimen 11 is cooled during the final step of the fusion operation. An example of some solvent metals which may be used in conjunction with the present invention are mercury, lead, thallium, and bismuth; however, it is to be understood that any solvent metal meeting the above requirements may be utilized. It should be noted in passing that a solvent metal need not of necessity be included as a constituent of the alloy pellet 12, successful fusions having been performed in its absence. An advantage gained by the omission of the solvent metal is the ease with which the alloy button produced during the fusion operation may be removed. It has been found that no etching is necessary, but the button may, in fact, merely be wiped off as it remains in the liquid phase at room temperature due to the peculiar nature of gallium.

An example of an alloy, exclusive of the added alkali metal, and methods in which they may be employed for creating the fused junction in the germanium crystal may be found in the previously referred to copending U. S. patent application of Justice N. Carman, Jr.

The active agent, namely the aforementioned alkali metal, is added to the alloy during the formation thereof. Upon solidification, the alloy precludes the fluxing agent from reacting with oxygen until the moment of fusion when the alloy is again molten. In the molten state, the active agent, that is, the alkali metal is free to reduce any oxide in contact with the alloy surface. In particular, only the crystal surface in contact with the alloy is attacked and the surface recombination velocity of the carriers of the remainder of the semiconductor crystal are not thereby affected. The alkali oxides or silicates formed are easily removed by acid etches leaving no residues. The active element or metal may consist of any of the alkli metals as above mentioned or of the alkali earth metals which will alloy suitably with the gallium forming the main constituent of the alloy pellet.

Figure 2:
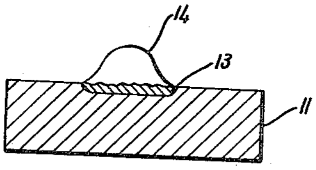
Fig. 2 is a sectional view of a semiconductor device in an intermediate stage of production according to the method of the present invention.

In Fig. 2 there is shown the germanium starting crystal 11 after alloy pellet 12 has been fused thereto. This is effected by heating the crystal and pellet to a predetermined temperature above the melting point of the alloy, but below the melting point of the crystal to melt the alloy pellet 12 and dissolve therein an adjacent region 13 of crystal 11. This aforementioned temperature is slightly higher than the melting point of the semiconductor-alloy button eutectic. As the alloy pellet is melted the alkali metal flux therein contained removes the germanium dioxide layer from the germanium specimen 11, allowing the melting of a region of the specimen and the dissolving of a predetermined amount thereof. This reaction proceeds until equilibrium has been reached at the particular applied temperature. The specimen is then cooled at a controlled rate to regrow onto the germanium specimen substantially all of the dissolved germanium, together with substituted atoms of gallium from the alloy pellet, thereby treating a P-type region which is separated from the remainder of the N-type starting crystal by a P–N junction.

After substantially all of the dissolved germanium has been precipitated out of solution onto the germanium specimen and the P–N junction has been created, the crystal is further cooled to solidify the remainder of the dissolved germanium and gallium, together with the solvent metal from the original alloy pellet 12, as an alloy button 14, which is fused to and in ohmic contact with the newly grown P-type region 13.

Figure 3:
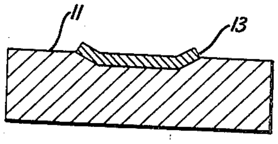
Fig. 3 is a sectional view of the device of Fig. 2 after the alloy button has been removed.

Fig. 3 shows the device of Fig. 2 after the alloy button 14 has been removed by any etching process known to the art to clean the surface of the specimen 11, and particularly the external periphery of the newly formed P–N junction. It is to be expressly understood, however, that this step is not necessary unless a solvent metal is included in the alloy pellet 12, for as hereinbefore described when gallium and an alkali metal alone are used, the resulting button 14 can be merely wiped off. The device of Fig. 3 may now be employed directly as a fused junction diode.

Figure 4:
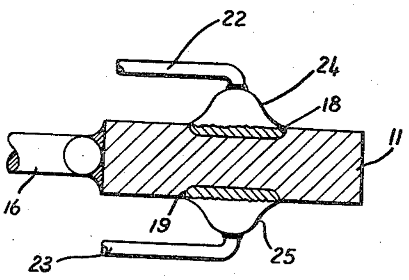
Fig. 4 is a sectional view of a fused-junction transistor produced according to the method of the present invention.

In Fig. 4 there is shown a completed transistor which is produced by fusing two alloy pellets to opposite sides of the germanium starting crystal 11. Base electrode 16 is preferably soldered to collector region 13 to provide an ohmic contact thereto. Likewise collector region 18 and emitter region 19 are electrically connected to alloy buttons 24 and 25 to their respective leads 22 and 23.

Figure 5:
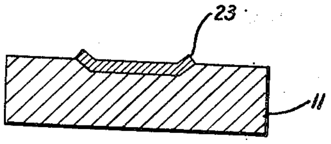
Fig. 5 is a sectional view of a semiconductor device of one conductivity type to which there has been grown a region of the same conductivity type for use as an ohmic contact.

In Fig. 5 there is shown crystal 11 to which has been connected an ohmic contact 23 by fusing an alloy pellet to the crystal, the pellet containing an active impurity, an alkali metal, as previously explained, and an active impurity of the same conductivity type as that of crystal 11; region 23 being thus of N-type conductivity if crystal 11 is of N-type conductivity, for example.

It may be recalled that one of the required characteristics of the alloy pellet 12, which is to be employed in carrying out the method of the present invention is that the melting point of the pellet be considerably below the melting point of the germanium.

There has thus been disclosed a new and novel method for producing fused junction semiconductor devices at lower temperature than possible heretofore. The method of the invention further provides for wetting of the alloy at the interface with the crystal without damage to the remaining surface of the semiconductor crystal.

What is claimed as new is:

1. The method of fusing a metal alloy pellet to a region of an active impurity-doped semiconductor starting crystal, said method including the steps of: placing an alloy pellet including an alkali metal selected from the group consisting of sodium, potassium, cesium and rubidium and gallium in contact with a region of the crystal; heating the crystal and the pellet to a temperature above the melting point of the pellet, but below the melting point of the crystal, thereby to melt the alloy and dissolve therein an adjacent region of the crystal; and cooling the pellet and the crystal at a predetermined rate to regrow onto the crystal at least a portion of the dissolved crystal together with atoms of gallium from the pellet and to solidify the remainder of the pellet as an alloy button adjacent to and in contact with the regrown region.

2. The method of fusing a metal alloy pellet to a region of an active impurity-doped semiconductor starting crystal, said method including the steps of: placing an alloy pellet including sodium and gallium in contact with a region of the crystal; heating the crystal and the pellet to a predetermined temperature above the melting point of the pellet, but below the melting point of the crystal, thereby to melt the pellet and dissolve therein an adjacent region of the crystal; cooling the pellet and the crystal at a predetermined rate to regrow onto the crystal at least a portion of the dissolved crystal together with atoms of gallium from the pellet; and further cooling the pellet and the crystal to solidify the remainder of the pellet as an alloy button adjacent to and in electric contact with the regrown region.

3. The method of fusing a metal alloy pellet to a region of an active impurity-doped semiconductor starting crystal, said method including the steps of: placing an alloy pellet including sodium and gallium in contact with a region of the crystal; heating the crystal and the pellet to a predetermined temperature above the melting point of the pellet, but below the melting point of the crystal, thereby to melt the pellet and dissolve therein an adjacent region of the crystal; cooling the pellet and the crystal at a predetermined rate to regrow onto the crystal at least a portion of the dissolved crystal together with atoms of gallium from the pellet; further cooling the pellet and the crystal to solidify the remainder of the pellet as an alloy button adjacent to and in contact with the regrown region; and removing the alloy button from the regrown region to expose the surface of the regrown region.

4. The method of removing the oxide layer from a region of a monatomic semiconductor starting crystal and simultaneously fusing a metal alloy pellet to the region of the crystal, said method comprising the steps of: placing an alloy pellet including gallium and an alkali metal selected from the group consisting of potassium, sodium, cesium and rubidium in contact with a region of the crystal; heating the alloy and the crystal to a predetermined temperature above the melting point of the alloy pellet, but below the melting point of the crystal, thereby to melt the alloy pellet and to permit the alkali metal to remove the oxide layer on the crystal and simultaneously to dissolve the adjacent region of the crystal; cooling the alloy pellet and the crystal at a predetermined rate to regrow onto the crystal a portion of the dissolved crystal together with atoms of gallium from the alloy pellet; and further cooling the alloy pellet and the crystal to solidify the remainder of the pellet as an alloy button adjacent the regrown region; and removing the alloy button from the regrown region to expose the surface of the regrown region.

5. The method of removing the oxide layer from a region of a monatomic semiconductor starting crystal and simultaneously fusing a metal alloy pellet to the region of said crystal, said method comprising the steps of: placing an alloy pellet including sodium and gallium in contact with a region of the crystal; heating the pellet and the crystal to a predetermined temperature above the melting point of the pellet, but below the melting point of the crystal, thereby to melt the pellet and to permit the sodium to remove the oxide layer on the crystal and simultaneously to dissolve the adjacent region of the crystal; cooling the pellet and the crystal at a predetermined rate to regrow onto the crystal at least a portion of the dissolved crystal together with atoms of gallium from the pellet; further cooling the pellet and the crystal to solidify the remainder of the pellet as an alloy button adjacent the regrown region; and removing the alloy button from the regrown region to expose the surface of the regrown region.

6. The method of producing a fused P–N junction in an N-type conductivity semiconductor starting crystal by converting a region of the N-type semiconductor crystal to P-type conductivity, said method comprising the steps of: placing an alloy pellet including gallium and an alkali metal selected from the group consisting of potassium, sodium, cesium and rubidium in contact with a predetermined surface of the crystal; heating the alloy pellet and the crystal to a temperature above the melting point of the alloy pellet, but below the melting point of the crystal, thereby to melt the alloy pellet and dissolve therein an adjacent region of the crystal; cooling the pellet and the crystal at a predetermined rate to regrow onto the crystal at least a portion of the dissolved crystal together with atoms of gallium from the pellet, thereby creating a regrown region of the P-type; further cooling the pellet and the crystal to solidify the remainder of the pellet as an alloy button adjacent to and in electric contact with the regrown region.

7. The method of producing a fused P–N junction in an N-type active impurity-doped semiconductor starting crystal by converting a region of the N-type crystal to P-type conductivity, said method comprising the steps of: placing an alloy pellet including sodium, a solvent metal and gallium in contact with a predetermined surface of the crystal; heating the alloy and the crystal to a predetermined temperature above the melting point of the alloy pellet, but below the melting point of the crystal, thereby to melt the alloy pellet and dissolve therein an adjacent region of the crystal; cooling the pellet and the crystal at a predetermined rate to regrow onto the crystal at least a portion of the dissolved crystal together with atoms of gallium from the alloy pellet, thereby creating a regrown region of the P-type; further cooling the pellet and the crystal to solidify the remainder of the pellet as an alloy button adjacent the regrown region; and etching away the alloy button from the regrown region to expose the surface of the regrown region.

8. The method of removing the silicon-dioxide layer from a region of a silicon starting crystal and simultaneously fusing a metal alloy pellet to the region of the crystal, said method comprising the steps of: placing an alloy pellet including sodium and gallium in contact with a region of the crystal; heating the pellet and the crystal to a predetermined temperature above the melting point of the pellet, but below the melting point of the silicon, thereby to melt the pellet and to permit the sodium to remove the silicon-dioxide layer on the crystal and simultaneously to dissolve an adjacent region of the crystal; cooling the pellet and the crystal at a predetermined rate to regrow onto the crystal at least a portion of the dissolved crystal together with atoms of gallium from the pellet; and further cooling the pellet and the crystal to solidify the remainder of the alloy pellet as an alloy button adjacent to and in electric contact with the regrown region.

9. The method of removing the germanium-dioxide layer from a region of a germanium starting crystal and simultaneously fusing a metal alloy pellet to the region of the crystal, said method comprising the steps of: placing an alloy pellet including sodium, a solvent metal and gallium in contact with a region of the crystal; heating the alloy pellet and the crystal to a predetermined temperature above the melting point of the pellet, but below the melting point of the germanium to melt the pellet to permit the sodium to remove the germanium-dioxide layer on the crystal and simultaneously dissolve an adjacent region of the crystal; cooling the pellet and the crystal at a predetermined rate to regrow onto the crystal at least a portion of the dissolved crystal together with atoms of gallium from the alloy pellet; further cooling the pellet and the crystal to solidify the remainder of the pellet as an alloy button adjacent the regrown region; and etching off the alloy button from the regrown region to expose the surface of the regrown region.

10. The method of producing an ohmic contact to a P-type conductivity semiconductor starting crystal by fusing a metal alloy pellet containing gallium to the starting crystal, said method including the steps of: placing an alloy pellet including sodium and gallium in contact with a region of the crystal; heating the crystal and the pellet to a predetermined temperature above the melting point of the pellet, but below the melting point of the crystal, thereby to melt the pellet and to dissolve therein an adjacent region of the crystal; cooling the pellet and the crystal at a predetermined rate to regrow onto the crystal at least a portion of the dissolved crystal together with atoms of gallium from the pellet; and further cooling the pellet and the crystal to solidify the remainder of the pellet as an alloy button adjacent to and in electric contact with the regrown region.

11. In a fused junction semiconductor translating device, the combination comprising: a semiconductor crystal of one conductivity type; said crystal having therein a region of the opposite conductivity type; and a metallic alloy button molecularly connected to said crystal at said region, said button consisting essentially of gallium, an alkali metal selected from the group consisting of sodium, potassium, cesium and rubidium and a solvent metal.

12. A fused junction semiconductor translating device comprising: a semiconductor crystal of one conductivity type; said crystal having therein two spaced regions, each being of the opposite conductivity type; and two metallic alloy buttons, each being electrically connected to said crystal at one of said regions, each of said buttons consisting essentially of gallium, an alkali metal selected from the group consisting of sodium, potassium, cesium and rubidium and a solvent metal.

References Cited in the file of this patent

UNITED STATES PATENTS

| | | |
|---|---|---|
| 2,644,852 | Dunlap | July 7, 1953 |
| 2,725,315 | Fuller | Nov. 29, 1955 |
| 2,725,316 | Fuller | Nov. 29, 1955 |
| 2,742,383 | Barnes et al. | Apr. 17, 1956 |